United States Patent [19]
Jones Jr.

[11] Patent Number: 5,373,463
[45] Date of Patent: Dec. 13, 1994

[54] FERROELECTRIC NONVOLATILE RANDOM ACCESS MEMORY HAVING DRIVE LINE SEGMENTS

[75] Inventor: Robert E. Jones Jr., Austin, Tex.

[73] Assignee: Motorola Inc., Schaumburg, Ill.

[21] Appl. No.: 86,254

[22] Filed: Jul. 6, 1993

[51] Int. Cl.$^5$ ............................................. G11C 11/22
[52] U.S. Cl. ................................. 365/145; 365/149; 365/227; 365/228
[58] Field of Search ................. 365/145, 227, 228, 149

[56] References Cited

U.S. PATENT DOCUMENTS

| | | | |
|---|---|---|---|
| 4,809,225 | 2/1989 | Dimmler et al. | 365/145 |
| 4,873,664 | 10/1989 | Eaton, Jr. | 365/145 |
| 5,031,143 | 7/1991 | Jaffe | 365/145 |
| 5,086,412 | 2/1992 | Jaffe et al. | 365/145 |
| 5,121,353 | 6/1992 | Natori | 365/145 |
| 5,262,982 | 11/1993 | Brassington et al. | 365/145 |

OTHER PUBLICATIONS

Joseph T. Evans et al., "An Experimental 512-bit Nonvolatile Memory with Ferroelectric Storage Cell", IEEE Journal of Solid-State Circuits, vol. 23, No. 5, Oct. 1988, pp. 1171-1175.

David Bondurant et al., "Ferroelectrics for nonvolatile RAMs", IEEE Spectrum, Jul. 1989, pp. 30-33.

Primary Examiner—Eugene R. LaRoche
Assistant Examiner—Andrew Q. Tran
Attorney, Agent, or Firm—Daniel D. Hill

[57] ABSTRACT

A nonvolatile random access memory (60) includes a ferroelectric memory array (62). The memory array (62) includes memory cells (86–89 and 91–96) arranged in intersecting rows and columns, where the memory cells (86–89 and 91–96) are coupled to bit lines and word lines. Drive lines are disposed parallel to the bit lines and drive line segments are disposed parallel to the word lines. A drive line segment is coupled to a predetermined number of the memory cells of a row. Coupling transistors (80, 82, 84, and 90) couple a drive line segment to a drive line in response to the word line being selected. The ferroelectric memory array (60) provides the advantage of eliminating a change in the polarization state of non-accessed memory cells connected to a selected drive line, and also provides the advantage of reduced energy consumption.

20 Claims, 5 Drawing Sheets

FERROELECTRIC NONVOLATILE RANDOM ACCESS MEMORY HAVING DRIVE LINE SEGMENTS

FIELD OF THE INVENTION

This invention relates generally to integrated circuit memories and more particularly to a ferroelectric nonvolatile random access memory.

BACKGROUND OF THE INVENTION

A ferroelectric nonvolatile random access memory uses a ferroelectric capacitor as a storage element of each memory cell. Each memory cell stores a logic state based on the electrical polarization of the ferroelectric capacitor. The ferroelectric capacitor has a dielectric between its electrodes that comprises a ferroelectric material such as lead zirconate titanate (PZT). When a voltage is applied to the plates of the capacitor, the ferroelectric material is polarized in the direction of the electric field. The switching threshold for changing the polarization state of the ferroelectric capacitor is defined as the coercive voltage. The ferroelectric capacitor exhibits hysteresis, and the flow of current to the capacitor depends on its polarization state. If the voltage applied to the capacitor is greater than its coercive voltage, then the capacitor may change polarization states depending on the polarity of the applied voltage. The polarization state is retained after power is removed, thus providing nonvolatility. A ferroelectric capacitor can be switched between polarization states in about one nanosecond, which is faster than the programming time of most other nonvolatile memories such as EPROMs (Erasable Programmable Read Only Memories), EEPROMs (Electrically Erasable Programmable Read Only Memories), or flash EEPROMs. However, like other nonvolatile memories, a ferroelectric memory cell can only endure a limited number of read/write cycles before losing the ability to store data.

FIG. 1 illustrates in schematic diagram form ferroelectric memory cell array 20 in accordance with the prior art. Ferroelectric memory cell array 20 includes a plurality of bit lines labeled "BL", a plurality of word lines labeled "WL", and a plurality of drive lines labeled "DL". Each memory cell includes an access transistor and a ferroelectric capacitor. For example, memory cell 22 includes access transistor 24 and ferroelectric capacitor 26. A gate of access transistor 24 is coupled to word line 23, a first current electrode is coupled to bit line 27, and a second current electrode is coupled to a first plate electrode of ferroelectric capacitor 26. A second plate electrode of ferroelectric capacitor 26 is coupled to drive line 25. The memory cells of array 20 are arranged in rows and columns. A row of memory cells comprises a word line and all of the memory cells that are coupled to the word line. A column of memory cells comprises a bit line and all of the memory cells that are coupled to the bit line. For example, word line 23 and memory cells 22, 28, 30, and 32 comprise a row, and bit line 27 and memory cells 22, 34, and 36 comprise a column. The word lines are used to access a memory cell, while the bit lines are used to read or write data to the accessed memory cell. Note that in FIG. 1, the drive lines are disposed substantially parallel to the word lines, and the memory cells of a row are coupled to the same drive line.

During a write cycle of a memory having array 20, a logic high signal is applied to a selected word line. The logic high signal causes the access transistors coupled to the selected word line to be conductive, thus coupling the ferroelectric capacitors to their respective bit lines. To write a logic one into a memory cell, the bit line coupled to a selected memory cell is pulled to a logic low voltage, usually ground potential, while the drive line coupled to the memory cell is pulled to a voltage approximately equal to the power supply voltage provided to array 20. This causes a voltage potential across the ferroelectric capacitor having a magnitude greater than the coercive voltage, thus semi-permanently polarizing the dielectric material of the capacitor in the direction of the electric field. To write a logic zero into a selected memory cell, the bit line that is coupled to the selected memory cell is pulled to a voltage equal to approximately the power supply voltage, while the voltage on the drive line is reduced to approximately ground potential. In this case, the voltage potential across the capacitor has a magnitude greater than the coercive voltage, but with the polarity in the opposite direction. During a write operation, the voltage on the drive line is pulled to a voltage equal to approximately the power supply voltage and then reduced to ground potential. Thus, the logic state to be written into a cell is controlled by the state of the bit line. This allows different logic states to be written into the cells along a selected row.

To read a selected memory cell, the voltage on the bit line coupled to the selected cell is reduced, or "precharged" to ground potential and then allowed to float. The drive line coupled to the selected memory cell provides a drive line signal having a logic high voltage equal to about the power supply voltage (for example, 5.0 volts). While the drive line signal is high, the word line coupled to the memory cell is pulled to a logic high voltage. This causes the access transistor of the cell to be conductive. The amount of current flow sensed on the bit line is used to determine the logic state stored in the ferroelectric capacitor of the memory cell. A sense amplifier (not shown) is used to drive the voltage on the bit line to ground if the sensed voltage corresponds to a logic one, or to the power supply voltage if the sensed voltage corresponds to a logic zero.

A read cycle of array 20 is a destructive read, since the logic state of all of the cells being read is changed to the same polarization state. Therefore, at the end of each read cycle, the data is restored by using the sensed logic state on the bit lines to rewrite the previously existing polarization state into each cell. This is accomplished by switching the drive line signal between a high voltage and ground potential while the word line is high and the bit line is still at the read logic state.

A problem with array 20 is that during a read cycle, all of the ferroelectric capacitors of a row are exposed to additional fatigue cycles which reduces their useful life. In addition, during both read and write cycles, a drive line voltage is provided to an entire row of memory cells, resulting in increased power consumption as the size of the array is increased.

FIG. 2 illustrates in schematic diagram form prior art ferroelectric memory cell array 40. Ferroelectric memory cell array 40 includes a plurality of bit lines labeled "BL", a plurality of word lines labeled "WL", and a plurality of drive lines labeled "DL". Like prior art memory array 20 of FIG. 1, each memory cell includes an access transistor and a ferroelectric capacitor. For example, memory cell 42, includes access transistor 44 and ferroelectric capacitor 46. A gate of access transistor 44 is coupled to word line 43, a first current electrode is coupled to bit line 47, and a second current electrode is coupled to a first plate electrode of ferroelectric capacitor 46. A second plate electrode of ferroelectric capacitor 46 is coupled to drive line 45. The memory cells of array 40 are also arranged in rows and columns. A row of memory cells comprises a word line and the memory cells that are coupled to the word line. A column of memory cells comprises a bit line and all of the memory cells that are coupled to the bit line. For example, word line 43 and memory cells 42, 48, 50, and 52 comprise a row, bit line 47 and memory cells 42, 54, and 56 comprise a column. In array 40, the drives lines are disposed substantially parallel to the bit lines, and the memory cells of a column are coupled to the same drive line. Memory array 40 is accessed for read and write cycles the same way as memory array 20. However, since the drive line is coupled to all of the cells of a column, during a read operation the unselected memory cells also receive a drive line voltage. If some of the cells of the column are storing a logic zero, the voltage potential on the drive line may change or, "disturb", the polarization of the ferroelectric capacitors coupled to the drive line. If such a polarization change of the ferroelectric capacitor of a cell is large enough, or if a series of read operations cause additional disturbing of the polarization state, a change in the logic state of the memory cells may result. In addition to the disturb problem of memory array 40, there may also be a space penalty for disposing the drive lines parallel to the bit lines.

SUMMARY OF THE INVENTION

Accordingly, there is provided, in one form, a ferroelectric nonvolatile random access memory array having a plurality of memory cells arranged in intersecting rows and columns. A word line is coupled to each of the memory cells of a row, and a bit line is coupled to each of the memory cells of a column. Each of the memory cells includes a ferroelectric capacitor having first and second plate electrodes. A plurality of drive lines are disposed substantially parallel to the bit lines. A plurality of drive line segments are disposed substantially parallel to the word lines. Each drive line segment is coupled to the second plate electrode of the ferroelectric capacitor of a predetermined number of memory cells of a row. Each drive line segment is coupled to one of the drive lines. These and other features and advantages will be more clearly understood from the following detailed description taken in conjunction with the accompanying drawings.

DESCRIPTION OF A PREFERRED EMBODIMENT

Figure 3:
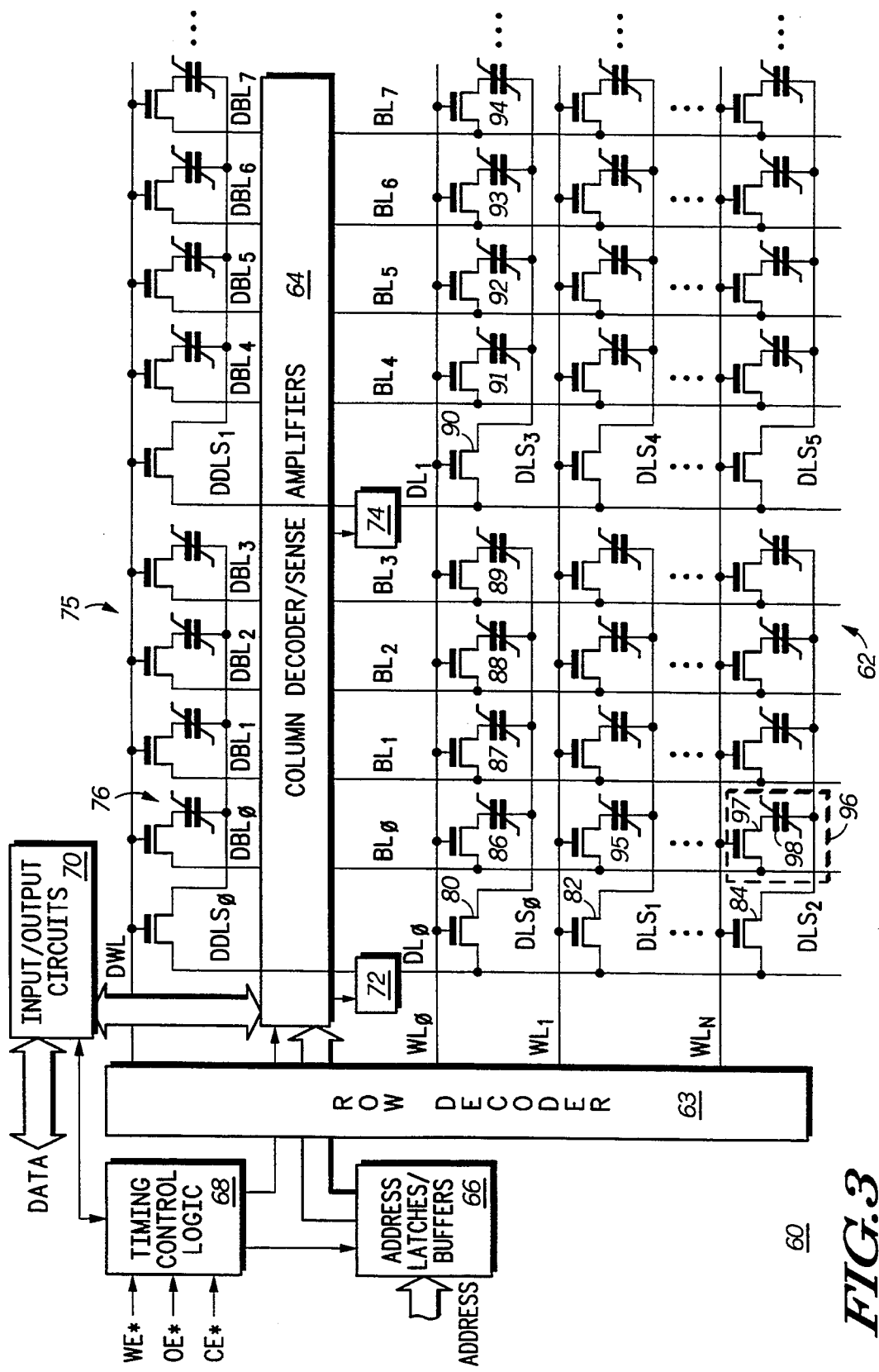
FIG. 3 illustrates in partial schematic diagram form and partial block diagram form a ferroelectric nonvolatile memory in accordance with the present invention.

FIG. 3 illustrates in partial schematic diagram form and partial block diagram form ferroelectric memory 60 in accordance with one embodiment of the present invention. Ferroelectric memory 60 includes memory cell array 62, row decoder 63, column decoder/sense amplifiers 64, address latches/buffers 66, timing control logic 68, data input/output circuits 70, and drive line drivers 72 and 74. Memory cell array 62 includes a plurality of one transistor, one capacitor ferroelectric memory cells arranged in rows and columns, a plurality of word lines labeled "$WL_0$", "$WL_1$", and "$WL_N$", a plurality of bit lines labeled "$BL_0$" through "$BL_7$", drive lines labeled "$DL_0$" and "$DL_1$", and drive line segments labeled "$DLS_0$" through "$DLS_5$". A row of memory cells includes a word line and the memory cells that are coupled to the word line. For example, word line $WL_0$, and memory cells 86–89 and 91–94 comprise a row of memory cells. The word lines are disposed substantially parallel to one another in one direction. A column of memory cells includes a bit line and the memory cells that are coupled to the bit line. For example, bit line $BL_0$, and memory cells 86, 95, and 96 comprise a column of memory cells. The bit lines are disposed substantially parallel to one another, and perpendicular to the word lines. Each one transistor, one capacitor memory cell includes an N-channel access transistor and a ferroelectric capacitor. For example, memory cell 96 includes access transistor 97 and ferroelectric capacitor 98. Access transistor 97 has a first current electrode connected to bit line $BL_0$, a second current electrode, and a control electrode connected to word line $WL_N$. Ferroelectric capacitor 98 has a first plate electrode connected to the second current electrode of access transistor 97, and a second plate electrode connected to drive line segment $DLS_2$. A plurality of dummy cells 75, such as dummy cell 76, are coupled to a dummy word line labeled "DWL", to dummy bit lines labeled "$DBL_0$" to "$DBL_7$", and to dummy drive line segments labeled "$DDLS_0$" and "$DDLS_1$". There is a dummy bit line corresponding to each bit line of array 62. The capacitance of a dummy bit line is designed to have about the same capacitance as a bit line of array 62. The dummy cells are similar to the memory cells of array 62, but have larger ferroelectric capacitors. The size of a dummy cell ferroelectric capacitor is chosen so that during a read cycle of memory 60, if reading a logic one, the current provided to a bit line by a memory cell of array 62 is smaller than the current provided by the corresponding dummy cell to a dummy bit line. If reading a logic zero from a memory cell of array 62, the current provided by the selected memory cell to a bit line is larger than the current provided by a corresponding dummy cell to a dummy bit line. When reading a logic zero from array 62, the polarization of the memory cell being read is reversed. When reading a logic one from a memory cell of array 62, the polarization of the memory cell being read is not reversed. Since a dummy cell always provides a logic one onto a dummy bit line during a read cycle, dummy cells 75 are not exposed to fatigue cycles.

A drive line segment is coupled to a predetermined number of memory cells. In FIG. 3, four memory cells are shown coupled to each drive line segment. However, the number of memory cells coupled to a drive line segment is not significant, and may be different in other embodiments depending on the size of the array, data organization, etc. Each drive line segment is coupled to a drive line by a coupling transistor. For example, coupling transistor 80 has a first current electrode connected to drive line $DL_0$, a second current electrode connected to drive line segment $DLS_0$, and a control electrode connected to word line $WL_0$. Memory cells 86–89 are coupled to drive line segment $DLS_0$. Drive line driver 72 is coupled to drive line $DL_0$, and drive line driver 74 is coupled to drive line $DL_1$. Drive line drivers 72 and 74 provide a drive line signal to the ferroelectric capacitors of each addressed memory cell during read and write operations of memory 60.

Address latches 66 receives external address signals labeled "ADDRESS", provides row address signals to row decoder 63, and provides column address signals to column decoder/sense amplifiers 64. Input/output circuits 70 receives external data signals DATA during a write cycle of memory 60, and in response, provides buffered data signals to column decoder/sense amplifiers 64. During a read cycle of memory 60, input/output circuits 70 receives data signals from column decoders/sense amplifiers 64 and in response, provides corresponding data signals DATA. Note that the number of data signals and address signals provided to, or received from memory 60 have no special significance and may be different in other embodiments.

Timing control logic 68 receives external control signals including a write enable signal labeled "WE*", an output enable signal labeled "OE*", and a chip enable signal labeled "CE*". Timing control logic 68 provides timing signals to control the word lines, drive lines, sense amplifiers, precharge and equalization, and data input and output of memory 60 during read and write cycles. The timing control of memory 60 may be synchronous (clocked) or asynchronous (not clocked). The type of timing control of memory 60 has no special significance and may be different in other embodiments. Note that an asterisk (*) after the signal name indicates that the signal is active at a logic low.

Each bit line of array 62 is coupled to column decoder/sense amplifiers 64. Column decoder/sense amplifiers 64 includes the column decoders and sense amplifiers for each bit line of memory array 62. Dummy cells 75 are also coupled to column decoder/sense amplifiers 64. The column decoder selects a bit line in response to receiving a column address signal. The sense amplifiers detect and amplify signals on the bit lines and provide corresponding output data signals to data input/output circuits 70 during a read cycle of memory 60. During a write cycle, the sense amplifiers are used to drive the bit lines for writing either a logic one or a logic zero into the selected memory cell. Row decoder 63 is coupled to each word line of memory array 62 and to dummy word line DWL. Row decoder 63 receives a row address signal and in response, selects a word line.

To read data from memory 60, chip enable signal CE* is a logic low, output enable signal OE* is a logic low, and write enable signal WE* is a logic high. Address latches/buffers 66 receives address signals ADDRESS, provides a buffered row address to row decoder 63 to select a word line, and provides a buffered column address to column decoder/sense amplifiers 64 to couple one or more of the bit lines to data input/output circuits 70. A drive line driver provides a drive line voltage which is approximately equal to the power supply voltage and greater in magnitude than the coercive voltage. For selected columns, the bit line and dummy bit line are "precharged" to ground potential and then allowed to float. Row decoder 63 provides a logic high voltage to the selected word line, causing the coupling transistor connected between the selected drive line and the appropriate drive line segment to become conductive. A drive line signal is provided to the ferroelectric capacitors of each memory cell coupled to the drive line segment. The dummy word line is also selected, providing a reference voltage for the sense amplifier. The stored polarization of the memory cell's ferroelectric capacitor will cause a current to flow, (the magnitude of which is based on the direction of polarization) and causes a small voltage to be sensed on the bit line by the sense amplifier. The sense amplifier drives the bit line to rail in the direction of the sensed voltage difference between the bit line and dummy bit line. Column decoder/sense amplifiers 64 couples the sense amplifier to data input/output circuits 70, which provides a single-ended data signal DATA corresponding to the sensed data. While the word line is still selected for the current read cycle, and the bit line has been driven to rail by the sense amplifier, the dummy word line is then reduced to approximately ground potential so that the dummy cells will remain at a logic one state. The drive line is then returned to ground potential while the word line is at a logic high voltage and the bit line is still at rail. This "rewrites", or restores the ferroelectric capacitor to its original logic state before the read cycle. Only the cells coupled to a selected drive line segment are restored. Note that the voltage of the drive line segment signal is equal to approximately the voltage of the drive line signal minus a threshold voltage ($V_T$) drop across the coupling transistor. There is also a $V_T$ drop across the access transistor of each cell. Therefore, for reliable low power supply voltage operations, for example 3.3 volts, it may be necessary to boost the word line voltage in order to reduce the $V_T$ drop across the coupling transistor and across the access transistor of each memory cell.

During a write cycle of memory 60, chip enable signal CE* and write enable signal WE* are provided as logic low voltages, and output enable signal OE* is provided a logic high voltage. Address latches/buffers 66 receives address signals ADDRESS, and provides a buffered row address to row decoder 63 for selecting a word line, and provides a buffered column address to column decoder/sense amplifiers 64 for coupling one or more bit lines to data input/output circuits 70, and also selects an appropriate drive line driver. To write a logic one into the selected memory cell, the sense amplifier drives the bit line to a logic low voltage. To write a logic zero, the sense amplifier drives the bit line to a logic high voltage. The selected drive line driver provides a logic high drive line signal to the drive line to which it is coupled. A logic high voltage on the selected word line is provided to the gate of the coupling transistor, causing the coupling transistor to be conductive, and electrically coupling a selected drive line to the appropriate drive line segment. A drive line segment signal on the drive line segment is provided to the second plate electrodes of the ferroelectric capacitors.

While the selected word line is still at a logic high and the addressed bit lines are still at the logic level corresponding to stored data, the voltage on the selected drive line and the drive line segment are reduced from approximately the power supply voltage to approximately ground potential. In the memory cells that are coupled to bit lines having a logic high voltage, this results in polarization of the ferroelectric capacitors in the direction of the electric field, and writes a logic one into the memory cell. In the memory cells coupled to bit lines that are at logic low voltages, an opposite polarity voltage is applied to the ferroelectric capacitors, and causes a polarization in dielectric in the opposite direction, which writes a logic zero into the memory cell.

Figure 1:
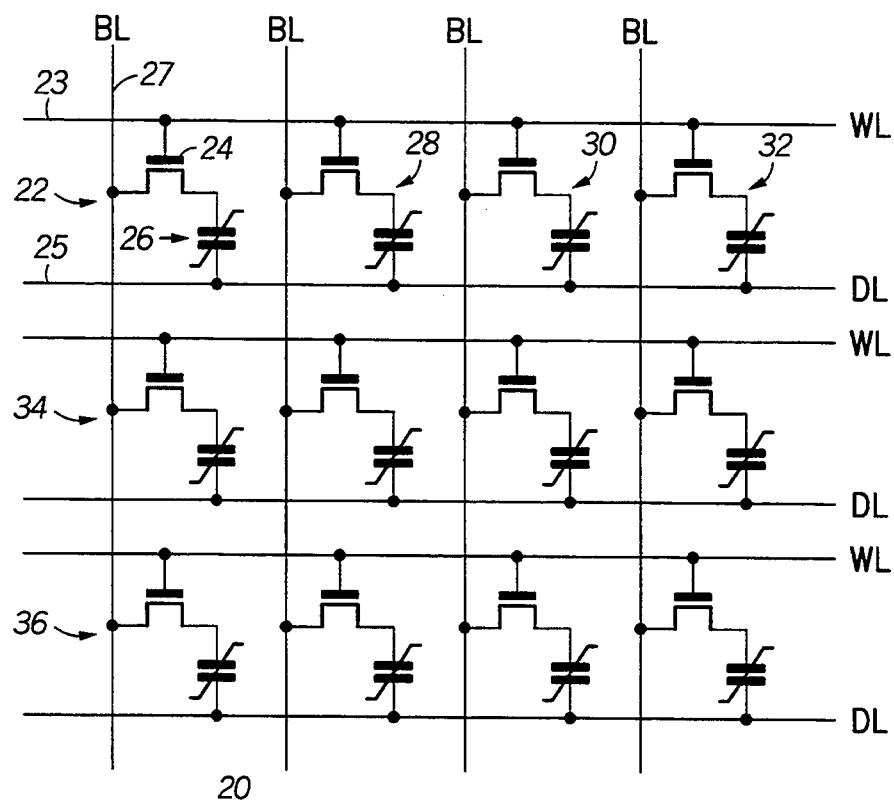
FIG. 1 illustrates in schematic diagram form an array of ferroelectric memory cells in accordance with the prior art.
Figure 2:
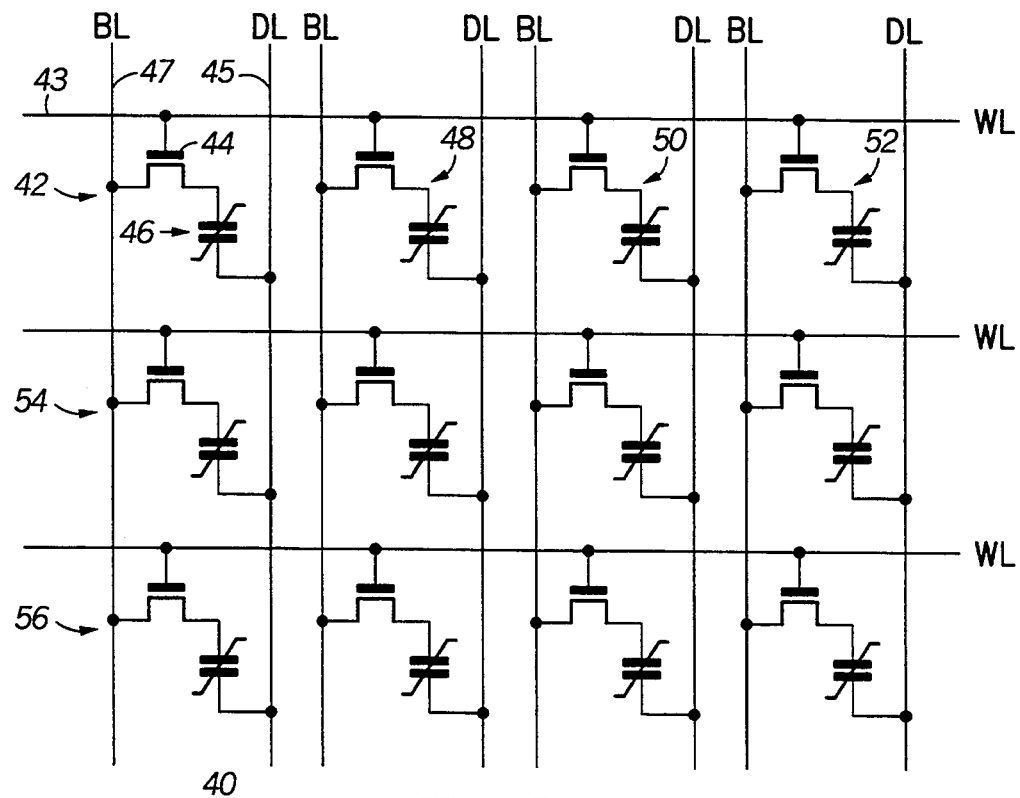
FIG. 2 illustrates in schematic diagram form another array of ferroelectric memory cells in accordance with the prior art.

There are several advantages in having drive lines parallel to the bit lines, with drive line segments parallel to, and controlled by the word lines. One advantage is reduced power consumption. Power consumption is reduced as compared to the prior art memory array of FIG. 1 because a drive line signal is only applied to the memory cells that are coupled to a selected drive line segment, instead of to an entire row. Another advantage is elimination of the disturb problem as described in the discussion with FIG. 2. The disturb problem is eliminated because the drive line segments are controlled by the word lines. During a read cycle, the rows that are not being accessed are not coupled to the drive line because the coupling transistors are substantially nonconductive. In addition, the useful life of the memory array is increased, since the number of memory cells that are exposed to additional fatigue cycles is reduced.

Figure 4:
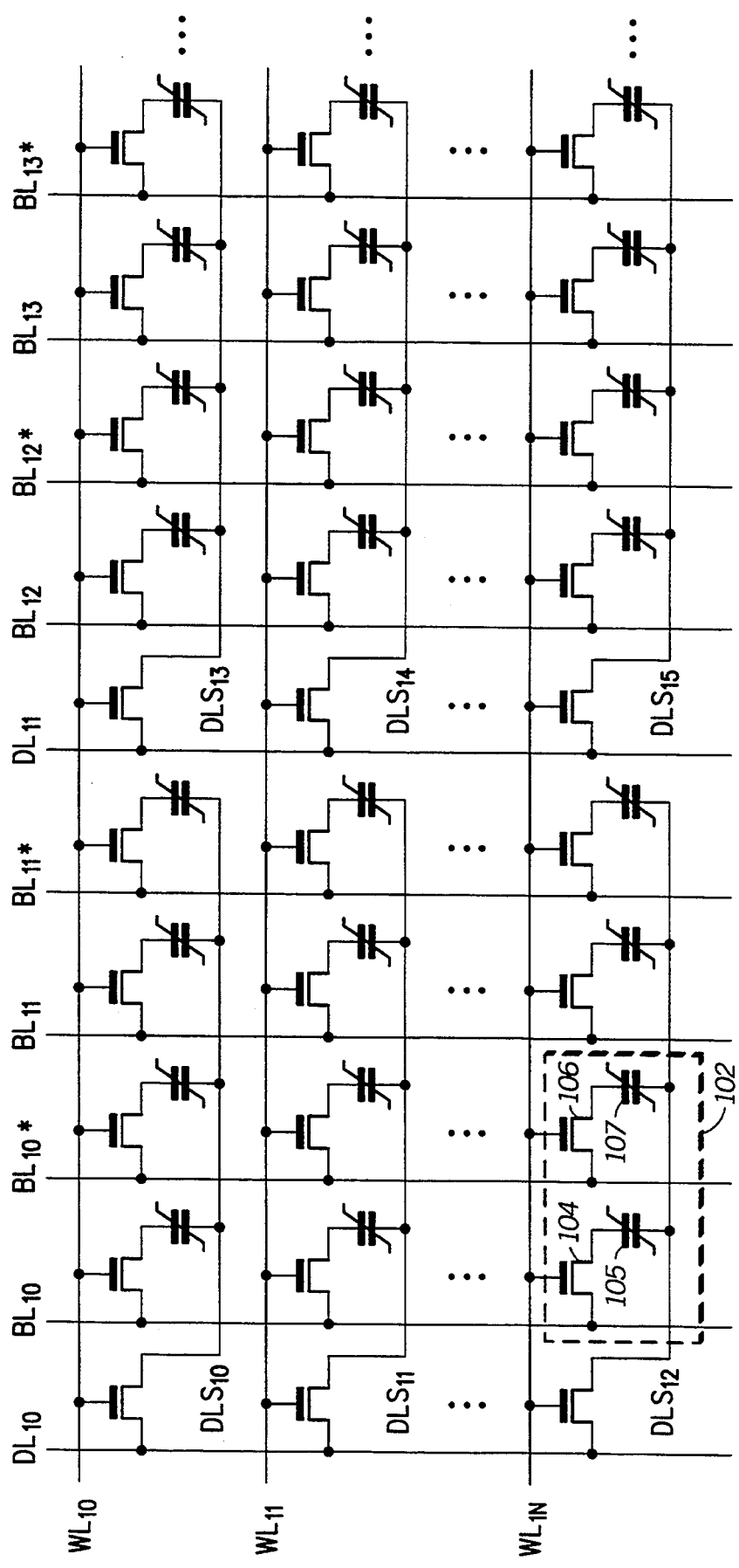
FIG. 4 illustrates in schematic diagram form a ferroelectric memory array in accordance with another embodiment of the present invention.
Figure 5:
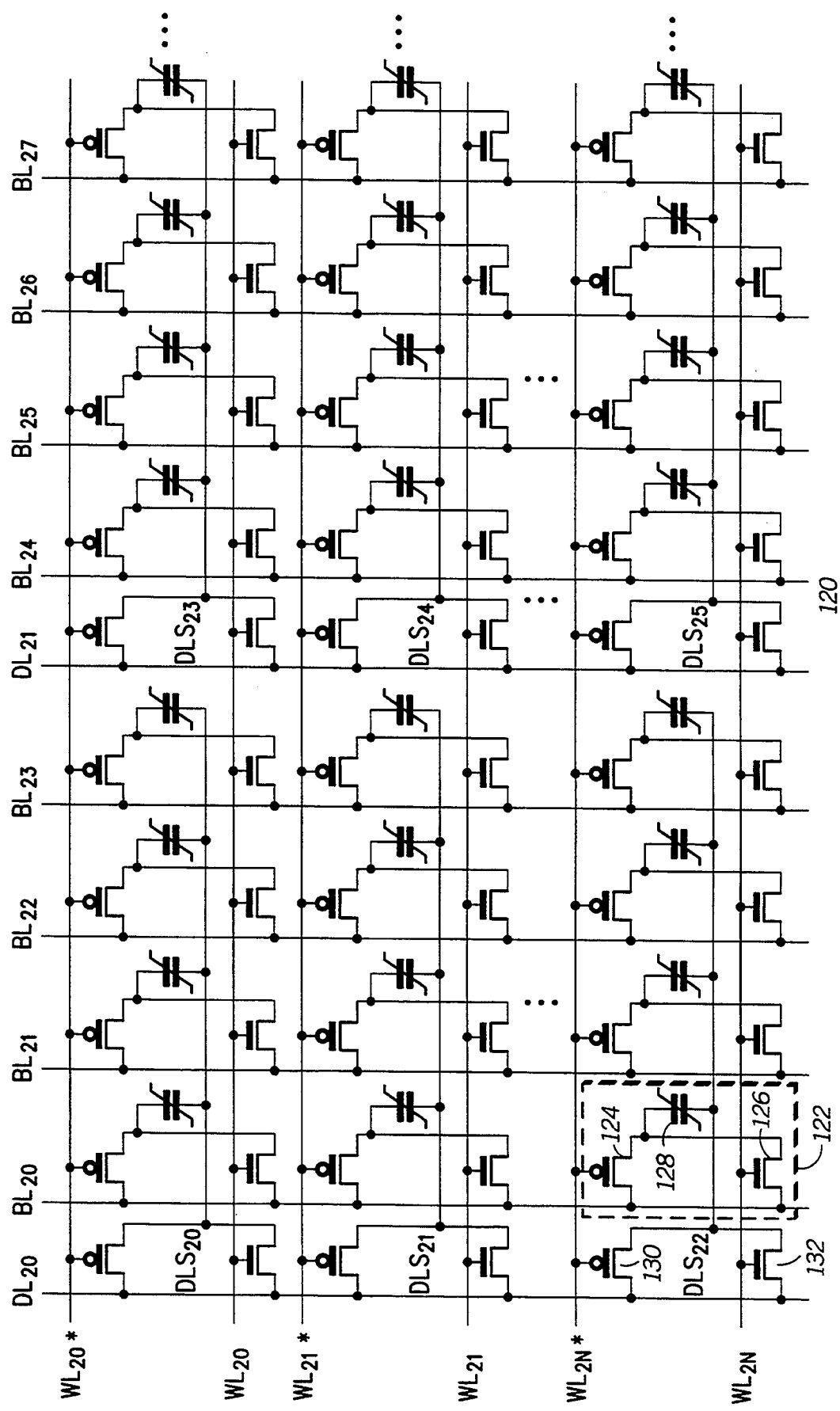
FIG. 5 illustrates in schematic diagram form a ferroelectric memory array in accordance with another embodiment of the present invention.
Figure 6:
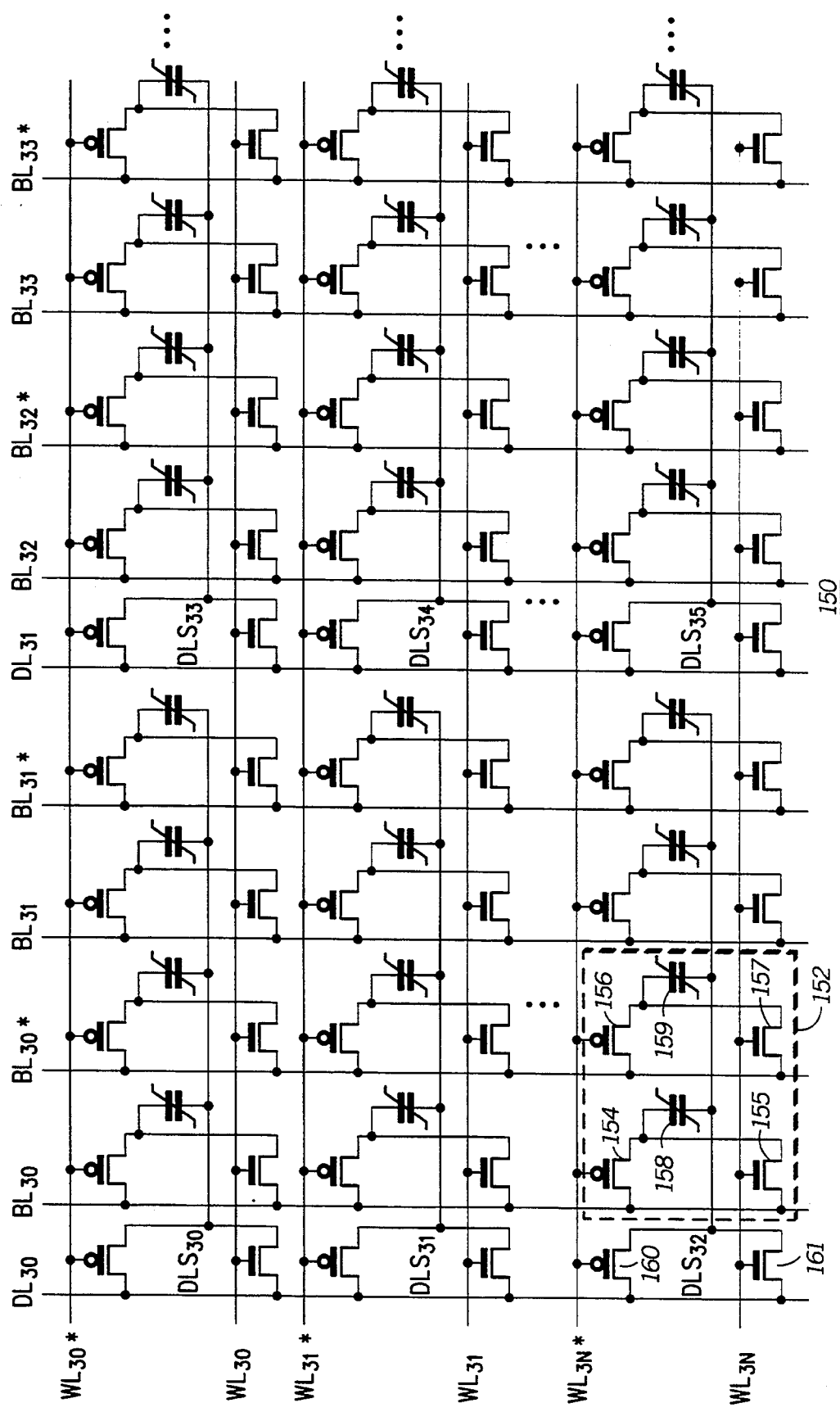
FIG. 6 illustrates in schematic diagram form a ferroelectric memory array in accordance with yet another embodiment of the present invention.

FIG. 4, FIG. 5, and FIG. 6 illustrate additional embodiments of memory array 62 of FIG. 3 having drive line segments parallel to, and controlled by, the word lines in accordance with the present invention. Each embodiment has particular advantages and disadvantages. FIG. 4 illustrates in schematic diagram form ferroelectric memory array 100 having a plurality of two transistor, two capacitor memory cells in accordance with another embodiment of the present invention. In memory array 100, bit line pairs are used to provide differential signals to sense amplifiers (not shown). This eliminates the need for including a row of dummy cells, and increases the speed of the memory. However, the size of the memory array is increased as compared to memory array 62.

Memory array 100 includes bit line pairs labeled "$BL_{10}/BL_{10}*$", "$BL_{11}/BL_{11}*$", "$BL_{12}/BL_{12}*$", and "$BL_{13}/BL_{13}*$", word lines labeled "$WL_{10}$", "$WL_{11}$", and $WL_{1N}$", drive lines labeled $DL_{10}$" and $DL_{11}$", and drive line segments labeled "$DLS_{10}$" through "$DLS_{15}$". Memory array 100 includes a plurality of two transistor, two capacitor memory cells, such as memory cell 102. Two transistor, two capacitor memory cell 102 includes access transistors 104 and 106, and ferroelectric capacitors 105 and 107. Access transistor 104 has a first current electrode connected to bit line $BL_{10}$, a second current electrode, and a control electrode connected to word line $WL_{1N}$. Ferroelectric capacitor 105 has a first plate electrode connected to the second current electrode of access transistor 104, and a second plate electrode connected to drive line segment $DLS_{12}$. Access transistor 106 has a first current electrode connected to bit line $BL_{10}*$, a second current electrode, and a control electrode connected to word line $WL_{1N}$. Ferroelectric capacitor 107 has a first plate electrode connected to the second current electrode of access transistor 106, and a second plate electrode connected to drive line segment $DLS_{12}$. Drive line segment $DLS_{12}$ is coupled to drive line $DL_{10}$ by coupling transistor 108. For purposes of illustration only, two memory cells are shown coupled to each drive line segment. Any number of memory cells may be coupled to a drive line segment depending upon the size of the array, data organization, etc.

FIG. 5 illustrates in schematic diagram form ferroelectric memory array 120 having two transistor, one capacitor memory cells in accordance with another embodiment of the present invention. In memory array 120, single-ended bit lines and word line pairs are used. In addition, there are two coupling transistors, an N-channel and a P-channel transistor. The use of two coupling transistors reduces the $V_T$ loss between the drive line and the drive line segments. In addition, the use of two access transistors coupled to complementary word line pairs reduces the $V_T$ drop that is seen by the ferroelectric capacitor. However, this increases the size of the array because there are more transistors per cell, and increases the complexity of the array because the array includes both P-channel and N-channel transistors.

Memory array 120 includes bit lines labeled "$BL_{20}$" through "$BL_{27}$", word line pairs labeled "$WL_{20}/WL_{20}*$", "$WL_{21}/WL_{21}*$", and "$WL_{2N}/WL_{2N}*$", drive lines "$DL_{20}$" and "$DL_{21}$", and drive line segments labeled "$DLS_{20}$" through "$DLS_{25}$". Memory array 120 includes a plurality of two transistor, one capacitor memory cells, such as memory cell 122. Two transistor, one capacitor memory cell 122 includes access transistors 124 and 126, and ferroelectric capacitor 128. Access transistor 124 is a P-channel transistor and access transistor 126 is an N-channel transistor. P-channel access transistor 124 has a first current electrode connected to bit line $BL_{20}$, a second current electrode, and a control electrode connected to word line $WL_{2N}*$. N-channel access transistor 126 has a first current electrode connected to bit line $BL_{20}$, a second current electrode connected to the second current electrode of P-channel access transistor 124, and a control electrode connected to word line $WL_{2N}$. Ferroelectric capacitor 128 has a first plate electrode connected to the second current electrodes of access transistors 124 and 126, and a second plate electrode connected to drive line segment $DLS_{22}$. Drive line segment $DLS_{22}$ is coupled to drive line $DL_{20}$ by coupling transistors 130 and 132. For purposes of illustration only, four memory cells are shown coupled to each drive line segment. Any number of memory cells may be coupled to a drive line segment depending upon the size of the array, data organization, etc.

FIG. 6 illustrates in schematic diagram form ferroelectric memory array 150 having four transistor, two capacitor memory cells in accordance with another embodiment of the present invention. Memory array 150 uses both bit line pairs and word line pairs. In addition, there are two coupling transistors between each drive line and drive line segment. As discussed above with FIG. 5, the presence of two coupling transistors reduces the $V_T$ drop from the drive line to the drive line segments. In addition, the use of two access transistors coupled between each complementary word line and the corresponding ferroelectric capacitor reduces the $V_T$ drop that is seen by each ferroelectric capacitor. This allows for low voltage, high speed operation, but increases the size of the memory array.

Memory array 150 includes bit line pairs labeled "$BL_{30}/BL_{30}*$", "$BL_{31}/BL_{31}*$", "$BL_{32}/BL_{32}*$", and "BL$_{33}$/BL$_{33}$*", word line pairs labeled "WL$_{30}$/WL$_{30}$*", "WL$_{31}$/WL$_{31}$*", and "WL$_{3N}$/WL$_{3N}$*", drive lines labeled "DL$_{30}$" and "DL$_{31}$38 , and drive line segments labeled "DLS$_{30}$" through "DLS$_{35}$". Memory array 150 includes a plurality of four transistor, two capacitor memory cells, such as memory cell 152. Four transistor, two capacitor memory cell 152 includes access transistors 154–157, and ferroelectric capacitors 158 and 159. Access transistors 154 and 156 are P-channel transistors and access transistors 155 and 157 are N-channel transistors. P-channel access transistor 154 has a first current electrode connected to bit line BL$_{30}$, a second current electrode, and a control electrode connected to word line WL$_{3N}$*. N-channel access transistor 155 has a first current electrode connected to bit line BL$_{30}$, a second current electrode connected to the second current electrode of P-channel access transistor 154, and a control electrode connected to word line WL$_{3N}$. Ferroelectric capacitor 158 has a first plate electrode connected to the second current electrodes of access transistors 154 and 155, and a second plate electrode connected to drive line segment DLS$_{32}$. P-channel access transistor 156 has a first current electrode connected to bit line BL$_{30}$*, a second current electrode, and a control electrode connected to word line WL$_{3N}$*. N-channel access transistor 157 has a first current electrode connected to bit line BL$_{30}$*, a second current electrode connected to the second current electrode of P-channel access transistor 156, and a control electrode connected to word line WL$_{3N}$. Ferroelectric capacitor 159 has a first plate electrode connected to the second current electrodes of access transistors 156 and 157, and a second plate electrode connected to drive line segment DLS$_{32}$. Drive line segment DLS$_{32}$ is coupled to drive line DL$_{30}$ by coupling transistors 160 and 161. For purposes of illustration only, two memory cells are shown coupled to each drive line segment. As stated above, any number of memory cells may be coupled to a drive line segment depending upon the size of the array, data organization, etc.

While the invention has been described in the context of a preferred embodiment, it will be apparent to those skilled in the art that the present invention may be modified in numerous ways and may assume many embodiments other than that specifically set out and described above. For example, memory array 62 may be an array of dynamic random access memory cells instead of an array of ferroelectric memory cells. Accordingly, it is intended by the appended claims to cover all modifications of the invention which fall within the true spirit and scope of the invention.

What is claimed is:

1. A ferroelectric nonvolatile random access memory array, comprising:
    a plurality of memory cells arranged in intersecting rows and columns, a word line coupled to each of the memory cells of a row, a bit line coupled to each of the memory cells of a column, each of the memory cells comprising a ferroelectric capacitor having first and second plate electrodes;
    a plurality of drive lines disposed substantially parallel to the bit line; and
    a plurality of drive line segments disposed substantially parallel to the word lines, and coupled to the memory cells of the row, each drive line segment of the plurality of drive line segments coupled to the second plate electrodes of the ferroelectric capacitors of a predetermined number of the memory cells of the row, and to the plurality of drive lines, and each drive line segment of the plurality of drive lines segments coupled to a drive line of the plurality of drive lines.

2. The memory array of claim 1, further comprising a coupling transistor for coupling a drive line segment to a drive line in response to receiving a word line signal.

3. The memory array of claim 2, wherein the coupling transistor is an N-channel transistor.

4. The memory array of claim 3, wherein the N-channel transistor has a first current electrode coupled to the drive line, a second current electrode coupled to the drive line segment, and a control electrode coupled to the word line for receiving the word line signal.

5. The memory array of claim 1, wherein each memory cell of the plurality of memory cells further comprises an access transistor having a gate coupled to the word line, a first current electrode coupled to the bit line, and a second current electrode coupled to the first plate electrode of the ferroelectric capacitor.

6. The memory array of claim 1, wherein each memory cell of the plurality of memory cells is characterized as being a four transistor, two capacitor memory cell.

7. The memory array of claim 1, wherein each memory cell of the plurality of memory cells is characterized as being a two transistor, two capacitor memory cell.

8. The memory array of claim 1, wherein each memory cell of the plurality of memory cells is characterized as being a two transistor, one capacitor memory cell.

9. A random access memory, comprising:
    an array of memory cells arranged in a plurality of intersecting rows and columns, and having a plurality of word lines disposed in a first direction and a plurality of bit lines disposed in a second direction, a word line is coupled to each of the memory cells of a row, and a bit line is coupled to each of the memory cells of a column, each of the memory cells of the array comprising a capacitor having first and second plate electrodes;
    a row address decoder, coupled to the array of memory cells, for selecting a word line in response to receiving a row address signal;
    a plurality of drive lines disposed substantially parallel to the bit lines in the second direction;
    a drive line driver circuit, coupled to a drive line of the plurality drive lines, for providing a drive line signal to the drive line; and
    a plurality of drive line segments disposed substantially parallel to the word line in the first direction and coupled to the memory cells of the row, a drive line segment coupled to a predetermined number of the memory cells of the row, and the plurality of drive line segments being coupled to the plurality of drive lines in response to the row address decoder selecting the word line.

10. The random access memory of claim 9, wherein the capacitor is characterized as being a ferroelectric capacitor.

11. The random access memory of claim 9, further comprising a transistor having a first current electrode connected to a drive line, a second current electrode connected to a drive line segment, and a gate connected to the word line.

12. The random access memory of claim 9, wherein the array of memory cells comprises an array of one transistor, one capacitor ferroelectric memory cells.

13. The random access memory of claim 9, wherein the array of memory cells comprises an array of two transistor, two capacitor ferroelectric memory cells.

14. The random access memory of claim 9, wherein the array of memory cells comprises an array of two transistor, one capacitor ferroelectric memory cells.

15. The random access memory of claim 9, wherein the array of memory cells comprises an array of four transistor, two capacitor ferroelectric memory cells.

16. A ferroelectric nonvolatile random access memory, comprising:

an array of memory cells arranged in a plurality of intersecting rows and columns, and having a plurality of word lines disposed in a first direction and a plurality of bit lines disposed in a second direction, a word line is coupled to each of the memory cells of a row, and a bit line is coupled to each of the memory cells of a column, each of the memory cells of the array comprising a ferroelectric capacitor having first and second plate electrodes;

a row address decoder, coupled to the plurality of word lines, for selecting one of the plurality of word lines in response to receiving a row address signal;

a plurality of drive lines disposed substantially parallel to the bit lines in the second direction;

a drive line driver circuit, coupled to a drive line of the plurality of drive lines, for providing a drive line signal to the drive line;

a plurality of drive line segments disposed substantially parallel to the word lines in the first direction and coupled to the memory cells of the row, a drive line segment of the plurality of drive line segments coupled to a predetermined number of the memory cells of the row; and a plurality of coupling transistors, each coupling transistor having a first current electrode connected to one drive line of the plurality of drive lines, a second current electrode connected to one drive line segment of the plurality of drive line segments, and a control electrode connected to 17. The random access memory of claim 16, wherein the array of memory cells comprises an array of one transistor, one capacitor ferroelectric memory cells.

18. The random access memory of claim 16, wherein the array of memory cells comprises an array of two transistor, two capacitor ferroelectric memory cells.

19. The random access memory of claim 16, wherein the array of memory cells comprises an array of two transistor, one capacitor ferroelectric memory cells.

20. The random access memory of claim 16, wherein the array of memory cells comprises an array of four transistor, two capacitor ferroelectric memory cells.

* * * * *

UNITED STATES PATENT AND TRADEMARK OFFICE
CERTIFICATE OF CORRECTION

PATENT NO. : 5,373,463
DATED : Dec. 13, 1994
INVENTOR(S) : Robert E. Jones, Jr.

It is certified that error appears in the above-indentified patent and that said Letters Patent is hereby corrected as shown below:

In claim 16, column 12, line 15
    after "to" add --one of the plurality of word lines--.

Signed and Sealed this

Ninth Day of May, 1995

Attest:

BRUCE LEHMAN

Attesting Officer     Commissioner of Patents and Trademarks